(12) United States Patent
Luo et al.

(10) Patent No.: US 7,486,572 B2
(45) Date of Patent: Feb. 3, 2009

(54) VOLTAGE REGULATOR FOR MEMORY DEVICE

(75) Inventors: Xiao Luo, San Jose, CA (US); Tsung-Lu Syu, San Jose, CA (US)

(73) Assignee: Brilliance Semiconductor Intl. Inc., Tortola (VG)

( * ) Notice: Subject to any disclaimer, the term of this patent is extended or adjusted under 35 U.S.C. 154(b) by 91 days.

(21) Appl. No.: 11/452,439

(22) Filed: Jun. 14, 2006

(65) Prior Publication Data
US 2007/0070718 A1    Mar. 29, 2007

Related U.S. Application Data

(60) Provisional application No. 60/690,140, filed on Jun. 14, 2005.

(51) Int. Cl.
*G11C 5/14* (2006.01)
(52) U.S. Cl. .............. 365/189.09; 365/185.2; 365/229; 365/210.1; 365/210.12; 365/185.18; 315/287; 323/276
(58) Field of Classification Search .......... 365/185.2, 365/189.09, 229, 210.1, 210.12, 185.18; 315/287; 323/276
See application file for complete search history.

(56) References Cited

U.S. PATENT DOCUMENTS

| | | | |
|---|---|---|---|
| 4,691,123 A * | 9/1987 | Hashimoto | 327/546 |
| 5,189,316 A * | 2/1993 | Murakami et al. | 327/530 |
| 5,532,964 A * | 7/1996 | Cernea et al. | 365/189.09 |
| 5,874,830 A * | 2/1999 | Baker | 323/316 |
| 6,275,438 B1 * | 8/2001 | Jeong | 365/226 |
| 6,344,992 B1 * | 2/2002 | Nakamura | 365/154 |
| 6,363,029 B1 * | 3/2002 | Watanabe et al. | 365/230.06 |
| 6,519,191 B1 * | 2/2003 | Morishita | 365/189.09 |
| 6,781,888 B1 * | 8/2004 | Horch et al. | 365/189.09 |
| 6,891,764 B2 * | 5/2005 | Li | 365/189.15 |
| 7,046,576 B2 * | 5/2006 | Kim et al. | 365/230.05 |
| 2006/0050590 A1 * | 3/2006 | Nautiyal et al. | 365/226 |

\* cited by examiner

*Primary Examiner*—Anh Phung
*Assistant Examiner*—Eric Wendler
(74) *Attorney, Agent, or Firm*—Wang Law Firm, Inc.; Li K. Wang

(57) ABSTRACT

A voltage regulator for a static random access memory operating either in a standby mode or a operation mode is provided. The voltage regulator includes a reference voltage generating circuit for generating a reference voltage, a first control circuit connected to the reference voltage generating circuit for providing power supply during the standby mode of the SRAM, and a second control circuit connected to the reference voltage generating circuit for providing power in response to an enabling signal during the operation mode of the SRAM.

10 Claims, 4 Drawing Sheets

VOLTAGE REGULATOR FOR MEMORY DEVICE

CROSS-REFERENCE TO RELATED APPLICATIONS

This non-provisional application claims priority under 35 U.S.C. § 119(e) on Patent Application No. 60/690,140 filed in the United States on Jun. 14, 2005, the entire contents of which are hereby incorporated by reference.

BACKGROUND

1. Field of the Invention

The invention relates to a voltage regulator and in particular to a voltage regulator used to support an internal power supply for SRAM core power consumption.

2. Related Art

A digital system usually needs to constantly read and store digital data during operations. Therefore, memory units with the function of keeping data are important elements in a digital system. They can be categorized into the following types: the random access memory (RAM), the serial access memory (SAM), and the content access memory (CAM).

Memories are a main concern in low-power and high-speed designs. In a processor based SoC (System on Chip), they limit most of the time the speed and are the main part of the power consumption. No memory technology can simultaneously maximize speed and capacity at lowest cost and power.

For innovative portable and wireless devices, Systems on Chip (SoCs) containing several processors, memories and specialized modules are obviously required. Performances but also low-power are main issues in the design of such SoCs. SoCs contain millions of transistors and have to work at lower and lower supply voltages to avoid too high power consumption. Consequently, ROM and SRAM memories have to be designed to work at very low supply voltages and to be very robust while considering wire delays, signal input slopes, noise and crosstalk effects.

Low Power SRAM features low power consumption, making it the ideal memory for mobile devices such as cellular phones and PDAs. Most of these electrical devices have to operate either in standby mode or in operation mode. Since power consumption of memories are the main consumers, circuits may reduce their power consumption are very important.

SUMMARY

Accordingly, a voltage regulator for memory device thereof is provided. Features and advantages of the provided batter charge circuit and method thereof will be set forth in the description which follows, and in part will be apparent from the description, or may be learned by practice of the invention. The objectives and other advantages of the invention will be realized and attained by the method and apparatus particularly pointed out in the written description and claims of the present application, as well as the appended drawings.

To achieve these and other advantages and in accordance with the purpose of the invention, as embodied and broadly described, a voltage regulator for a static random access memory operating either in a standby mode or a operation mode is provided. The voltage regulator includes a reference voltage generating circuit for generating a reference voltage, a first control circuit connected to the reference voltage generating circuit for providing power supply during the standby mode of the SRAM, and a second control circuit connected to the reference voltage generating circuit for providing power in response to an enabling signal during the operation mode of the SRAM.

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

BRIEF DESCRIPTION OF THE DRAWINGS

The above and other objects, features and other advantages of the invention will be more clearly understood from the following detailed description when taken in conjunction with the accompanying drawings, in which.

DETAILED DESCRIPTION

Figure 1:
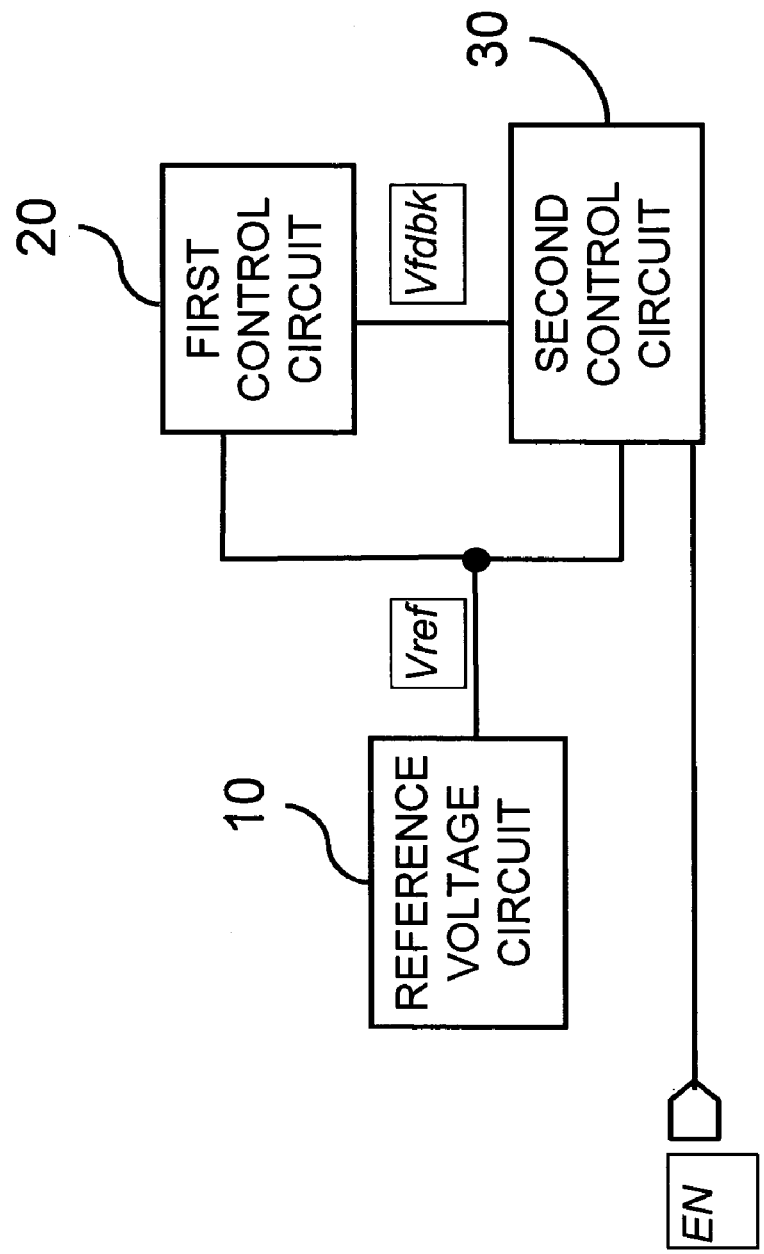
FIG. 1 illustrates the block diagram of the voltage regulator in accordance with the invention.

Reference will now be made in greater detail to a preferred embodiment of the invention, an example of which is illustrated in the accompanying drawings. Wherever possible, the same reference numerals are used throughout the drawings and the description to refer to the same or like parts. Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The voltage regulator is used to support an internal power supply for SRAM core power consumption. FIG. 1 shows the function block of the voltage regulator. The voltage regulator includes three circuit blocks which are reference voltage generating circuit 10, first control circuit 20, and second control circuit 30.

The reference voltage generating circuit 10 generates a reference voltage Vref, as a reference voltage for the first control circuit 20 and the second control circuit 30. The reference voltage Vref is compared with a feedback signal FDBK which is derived from an internal power supply VDD through the resistor voltage divider in FIG. 4. The comparison result is used to regulate the internal power supply VDD so that VDD is stable to a designed value in any circumstances. The first control circuit 20 is used to provide power for internal power supply during the standby mode of SRAM. The second control circuit 40 is employed to supply power when the SRAM is enabled. When the SRAM is enabled, the enabling signal EN, as shown in FIG. 1, is high. The first control circuit 30 is able to regulate VDD.

Figure 2:
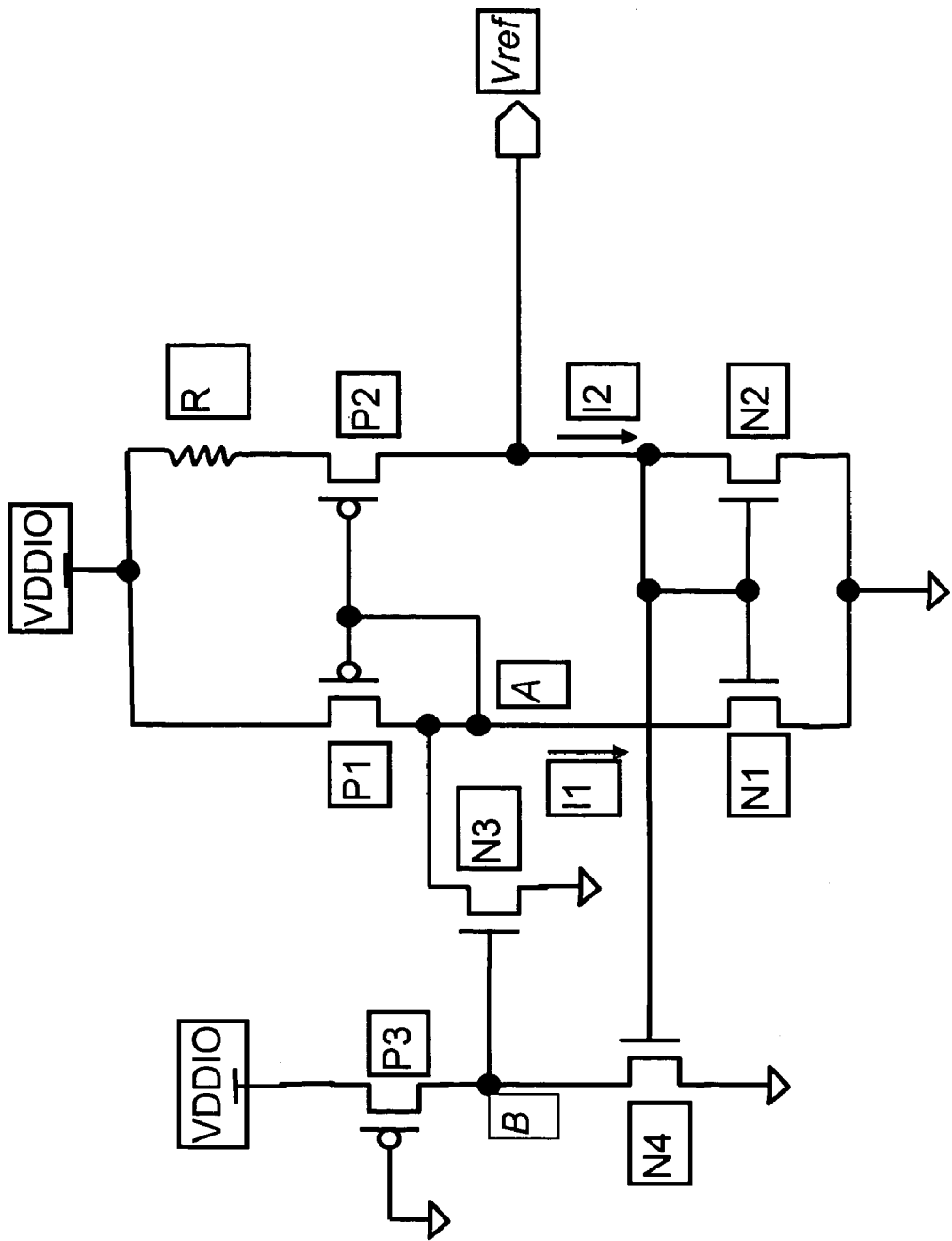
FIG. 2 illustrates the reference voltage generating circuit of the voltage regulator in accordance with the invention.

FIG. 2 depicts the reference voltage generating circuit 10. The reference voltage, Vref, generated by the reference voltage generating circuit 10, is used as a reference. The voltage level of the reference voltage Vref is required be stable and insensitive to the external power VDDIO and the temperature variation.

In order to make the reference voltage Vref insensitive to the external power VDDIO and temperature variation, a circuit consisting of resistor R and a first transistor N1, a second transistor N2, a third transistor P1, and a fourth transistor P2, is employed. The first and the second transistors are preferably NMOS transistors, while the third and the fourth transistors are PMOS transistors. The width-to-length (W/L) ratio of the first transistor N1 is equal to that of the second transistor N2, where W is the width and L is the length of the transistors. The equality of the ratio results in both transistors having the same current due to the current-mirror effect. Therefore, the currents passing through the third transistor P1 and the fourth transistor P2 respectively are the same or close, i.e., I1=I2, where I1 and I2 are the currents flowing through P1 and P2 respectively.

Also the gates of the third transistor P1 and the forth transistor P2 have the same voltage, i.e., Vgs(P1)=Vgs(P2)+ I2*R, where Vgs stands for the voltage between the gate and source of a transistor. It can be derived that the transconductance gm of the third transistor P1 is inversely proportional to the resistor R and also is determined by the ratio of W/L of the third transistor P1 and the fourth transistor P2. Thus, gm is independent of the external power VDDIO and the temperature. Furthermore, the transconductance gm over VDDIO and temperature of the third transistor P2, the first transistor N1, and the second transistor N2 are constant. Thus, the circuit is insensitive to the external power VDDIO and the temperature variations.

Optionally, a fifth transistor N3, a sixth transistor P3 and a seventh transistor N4 are included for the case in which the external power VDDIO is ramp up from ground. The fifth transistor N3 and the seventh transistor N4 are preferably NMOS, while the sixth transistor P3 is preferably PMOS. When VDDIO is zero, the voltages at the nodes A, B and C are zero. During the ramp-up, when VDDIO is greater than Vt(P3), the threshold voltage of the weak transistor P3, the sixth transistor P3 is turned on and the node B is charged. At the same time, the seventh transistor N4 is cut off since the voltage of the node C is still zero. When the voltage at node B is greater than Vt(N3), the fifth transistor N3 is turned on so that the node A is connected to the Ground. The third transistor P2 conducts so that the node C is charged. The seventh transistor N4 is turned on when Vref is greater than Vt(N4). The node B is pulled down to Ground so that the fifth transistor N3 is cut off. Thus, the circuit is in a stable state after the external power VDDIO ramp-up.

Figure 3:
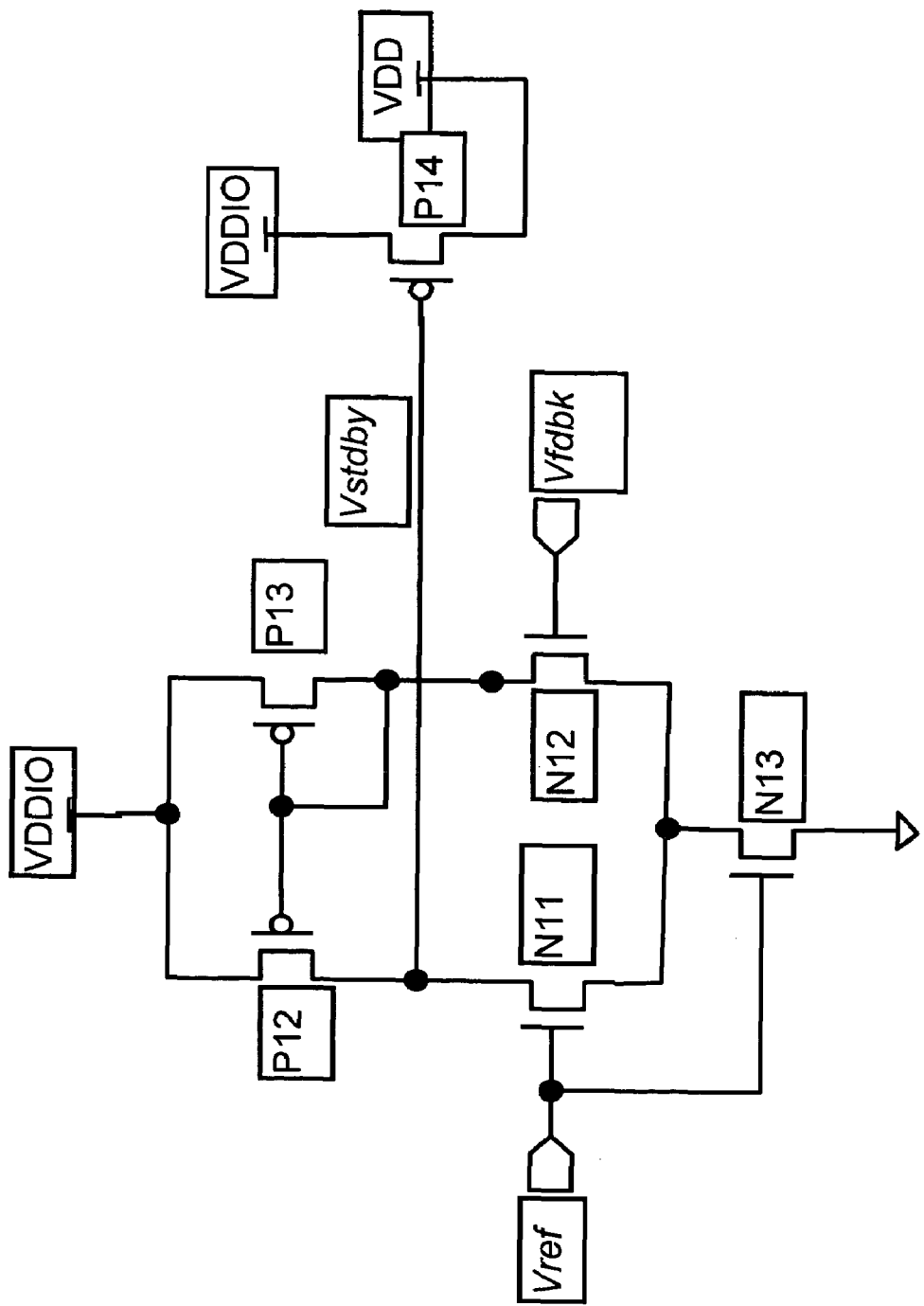
FIG. 3 illustrates the control circuit of the voltage circuit for the voltage regulator for the operation mode of SRAM in accordance with the invention.

In the standby mode, the SRAM chip is powered down in which all input and output buffer are disabled so that there is no operation power consumption. However, there is a very small power leakage from the internal voltage VDD to the ground. The circuit in FIG. 3 is the control circuit for the standby mode of the SRAM chip. The eighth transistor N11, the ninth transistor N12, the tenth transistor N13, the eleventh transistor P12, and the twelfth P13 are configured as a differential amplifier. The NMOS transistors N11, N12, and N13 are connected as a common mode differential pair. The inputs of the differential pair are Vref and Vfdbk. The gate of the transistor N13 is connected to input Vref. The PMOS transistors P12 and P13, connected as a current-mirror, are the load of the differential pair. Assuming that the voltage of Vfdbk is greater than or equal to that of Vref during the standby mode, the voltage of Vstdby is greater than VDDIO-Vt of the transistor P14 so that the transistor P4 is cut off. There is no current passing to VDD from VDDIO. When VDD is dropping down eventually due to power leakage, Vfdbk is going down proportionally. The differential input, Vref-Vfdbk, makes the amplifier output Vstdby going down. The transistor P14 eventually turns on. Current goes through the transistor P14 so that VDD is charged higher. When VDD is high enough so that the voltage of Vfdbk is greater than voltage of Vref, Vstdby is raising high gradually. When Vstdby is greater than VDDIO-Vt(P14), the transistor P14 cuts off so that there is no current charging VDD through the transistor P14.

Figure 4:
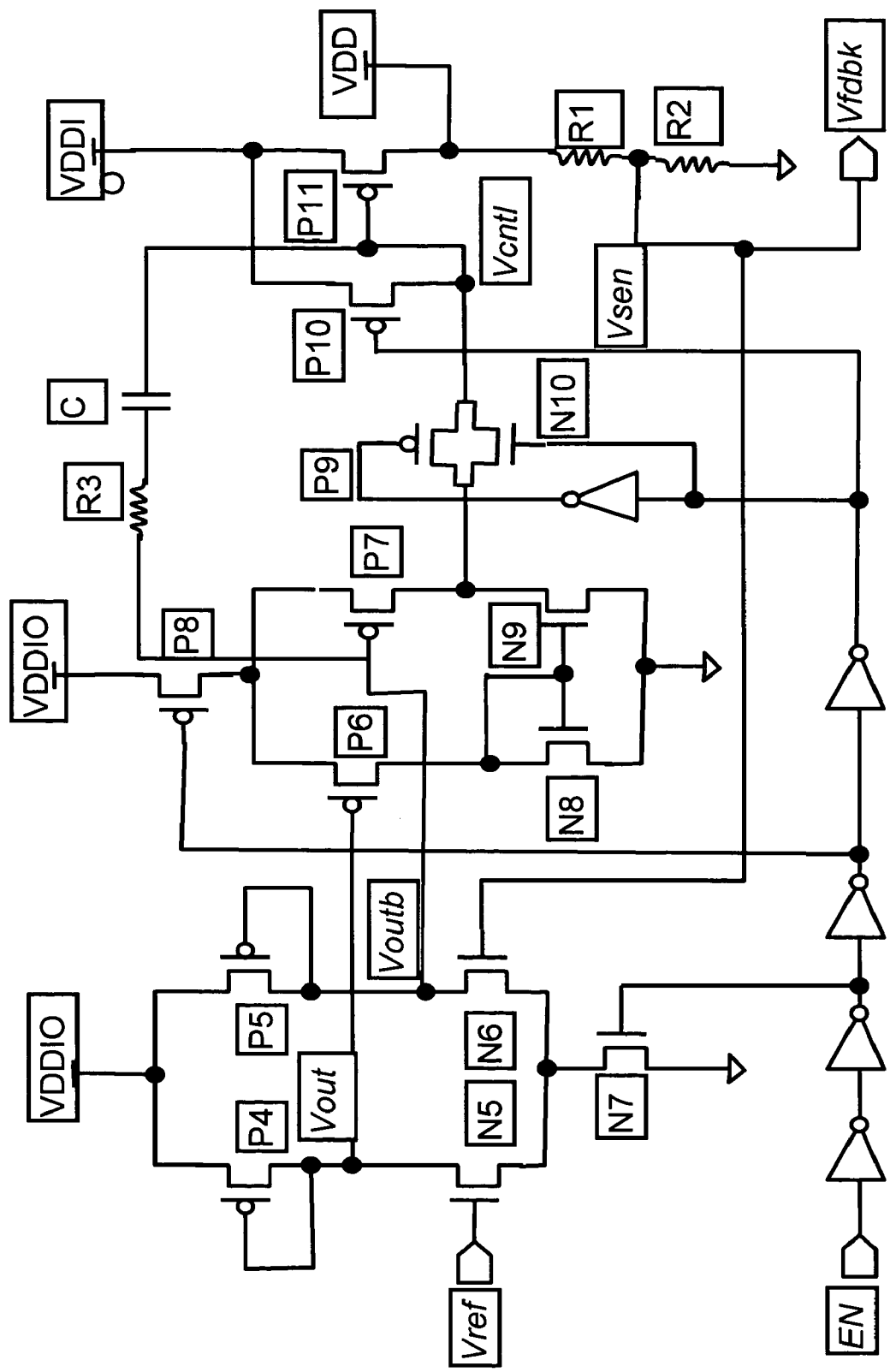
FIG. 4 illustrates the operation control circuit of the voltage regulator for the operation mode of SRAM in accordance with the invention.

FIG. 4 shows the operation control circuit for the operation mode. The control circuit consists of a two-stage differential amplifier, a voltage divider, an internal voltage driver. The thirteenth transistor N5, the fourteenth transistor N6, the fifteenth transistor N7, the sixteenth transistor P4, and seventeenth transistor P5 form the first stage differential amplifier while the eighteenth transistor N8, the nineteenth transistor N9, the twentieth transistor P6, the twenty-first transistor P7, and the twenty-second transistor P8 form the second stage differential amplifier. The output of the amplifier is connected to the signal Vcntl through a transmission gate having a twenty-third transistor N10 and a twenty-forth transistor P9. The voltage divider is connected to the internal voltage VDD. The output of the voltage divider Vfdbk is feedback to one input of the two-stage amplifier.

During the standby mode, the enabling signal EN is low. The transistor N7 and transistor P8 are cut off so that the two-stage differential amplifier is turned off. Also the transmission gate N10 and P9 is cut off. The signal Vsen is low so that the twenty-fifth transistor P10 is conducted. Thus, the signal Vcntl is charged up to VDDIO. The twenty-sixth P11 is cut off. Thus, there is no current going to VDD from VDDIO through P11 during the standby mode.

Assuming that the voltage on input Vref is greater than or equal to that on Vfdbk, in the operation mode, the input signal Ven is changed to high. In turn, the signal Vsen is high, and the transistor P10 is cut off. The two-stage differential amplifier is turned on. The signal Vcntl is connected to the output of the differential amplifier. During SRAM read/write operations, VDD is dropping down, which is forcing the signal Vfdbk getting lower. The output of the first stage amplifier, Voutb, is up while the other one, Vout, is down. In turn, since the transmission gate N10/P9 is on, the signal Vcntl goes down. Once the voltage on Vcntl is less than VDDIO-Vt(P11), the transistor P11 is turned on. Current flows through the transistor P11 from VDDIO to charge the internal power supply VDD. When VDD is charged to high enough so that the voltage on Vfdbk is greater than that on Vref, the voltage on out is greater than that on Voutb. In turn, the voltage on Vcntl goes up. When the voltage on Vcntl is higher than VDDIO-Vt(P11), the transistor P11 is off. There is no current from VDDIO to VDD.

Optionally, in order to ensure the closed-loop circuit is stable, the capacitor C is employed to realize dominant-pole compensation and the resister R3 is used to eliminate the right-half plane zero. By adjusting C and R3 components, the circuit can have a reasonable phase-margin. Therefore, the closed-loop circuit can reach the stability.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A voltage regulator for a static random access memory operating either in a standby mode or a operation mode, comprising:
   a reference voltage generating circuit for generating a reference voltage;
   a first control circuit connected to the reference voltage generating circuit for providing power supply during the standby mode of the SRAM, the first control circuit receiving the reference voltage from the reference voltage generating circuit; and
   a second control circuit connected to the reference voltage generating circuit for providing power in response to an enabling signal during the operation mode of the SRAM, the second control circuit receiving the reference voltage from the reference voltage generating circuit and generating a feedback signal,
   wherein the first control circuit being capable of adjusting the power supply according to the reference voltage and the feedback signal received from the second control circuit.

2. The voltage regulator of claim 1, wherein the reference voltage generating circuit further comprising:
   a resistor connected to an external power and having a resistance,
   a first transistor connected to the resistor,
   a second transistor connected to the external power and in parallel to the resistor and the first transistor, the second transistor having a transconductance,
   a third transistor connected to the first transistor, and
   a fourth transistor connected to the second transistor,
   wherein the transconductance of the second transistor is inversely proportional to the resistance of the resistor.

3. The voltage regulator of claim 1, wherein the first control circuit comprises a differential amplifier.

4. The voltage regulator of claim 1, wherein the first control circuit comprises a differential pair and a current-mirror connected to the differential pair.

5. The voltage regulator of claim 1, wherein the second control circuit comprises a two-stage differential amplifier having a first stage amplifier and a second stage amplifier, a voltage divider, an internal voltage driver.

6. The voltage regulator of claim 2, wherein the width-to-length (W/L) ratio of the first transistor is equal to that of the second transistor.

7. The voltage regulator of claim 2 further comprising:
   a fifth transistor connected to a second external power,
   a sixth transistor connected to the first transistor, and
   a seventh transistor connected to the second transistor,
   wherein the second external power being ramp up from ground.

8. The voltage regulator of claim 5, wherein the first stage amplifier comprises a eighth transistor, a ninth transistor, a tenth transistor, a eleventh transistor, and a twelfth transistor.

9. The voltage regulator of claim 5, wherein the second stage amplifier comprises a thirteenth transistor, a fourteenth transistor, a fifteenth transistor, a sixteenth transistor, and a seventeenth transistor.

10. The voltage regulator of claim 5, wherein the second control circuit further comprises a resistor and a capacitor.

* * * * *